United States Patent [19]
Carstens et al.

[11] Patent Number: 5,407,362
[45] Date of Patent: Apr. 18, 1995

[54] INTERCONNECTING MODULE SYSTEM

[75] Inventors: Robert J. Carstens, Phoenix; David Cucuzella, Gilbert; John E. Gatti, Scottsdale; Naufel C. Naufel, Tempe, all of Ariz.; John W. Toor, Palo Alto, Calif.

[73] Assignee: Motorola, Inc., Schaumburg, Ill.

[21] Appl. No.: 94,652

[22] Filed: Jul. 19, 1993

[51] Int. Cl.⁶ .............................................. H05K 7/10
[52] U.S. Cl. ................................. 439/347; 361/735
[58] Field of Search .............. 439/341, 347, 928, 376; 312/107, 107.5, 111; 361/683, 730, 735

[56] References Cited

U.S. PATENT DOCUMENTS

| | | | |
|---|---|---|---|
| 3,506,321 | 4/1970 | Hampel | 312/111 |
| 4,433,881 | 2/1984 | Witten et al. | 312/111 |
| 4,501,460 | 2/1985 | Sisler | 439/292 |
| 4,518,207 | 5/1985 | Gavonsky | 312/111 |
| 4,643,494 | 2/1987 | Marleau | 312/107 |
| 4,718,858 | 1/1988 | Godfrey et al. | 439/296 |
| 4,761,823 | 8/1988 | Fier | 439/358 |
| 4,916,578 | 4/1990 | Mast | 361/683 |
| 4,969,830 | 11/1990 | Daly et al. | 361/683 |
| 4,972,962 | 11/1990 | Price, Jr. | 211/194 |
| 5,156,556 | 10/1992 | Ma | 439/357 |

FOREIGN PATENT DOCUMENTS 1451323 9/1976 United Kingdom ............... 361/735

*Primary Examiner*—Neil Abrams
*Attorney, Agent, or Firm*—Harold C. McGurk, IV; S. Kevin Pickens

[57] ABSTRACT

A number of modules mechanically and electrically connect to each other to form an interconnecting module system. A latching mechanism connects each of the modules together. There is a backplane in each of the modules. The backplanes are interconnected when the modules are interconnected to each other. In addition, the modules can be stacked on top of each other and on top of a base. The base provides stability and support for the stack of modules.

17 Claims, 9 Drawing Sheets

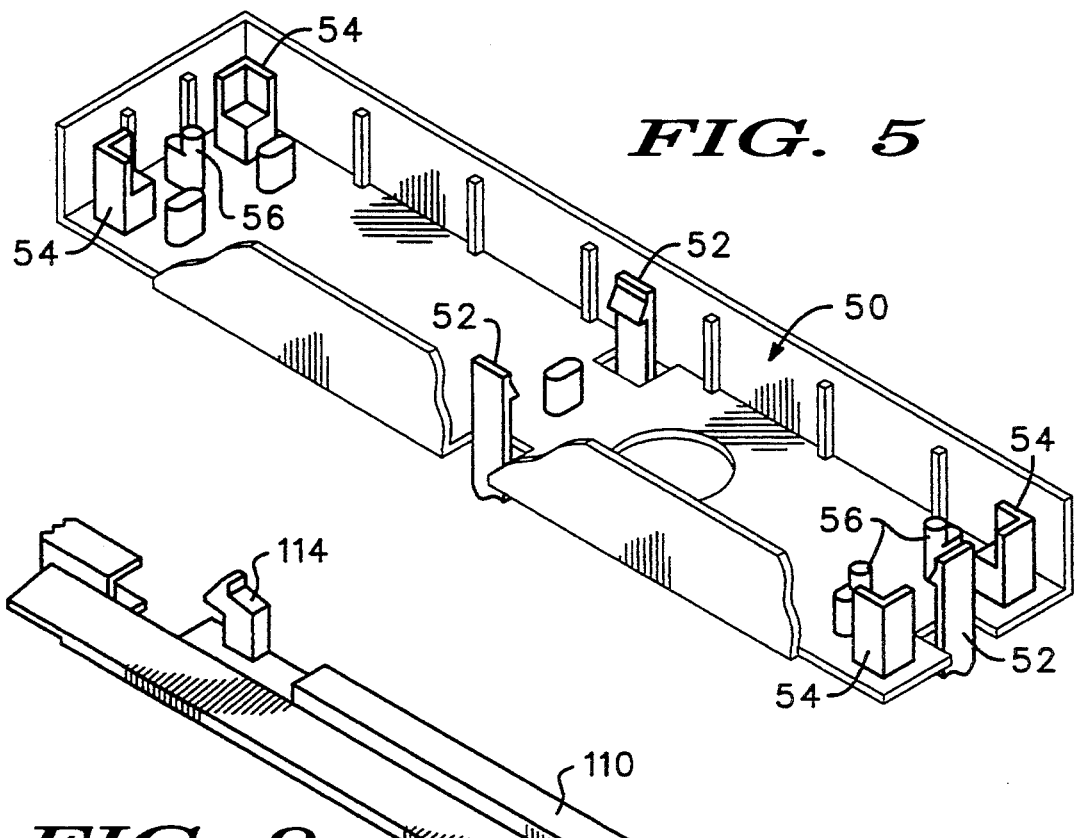
FIG. 5
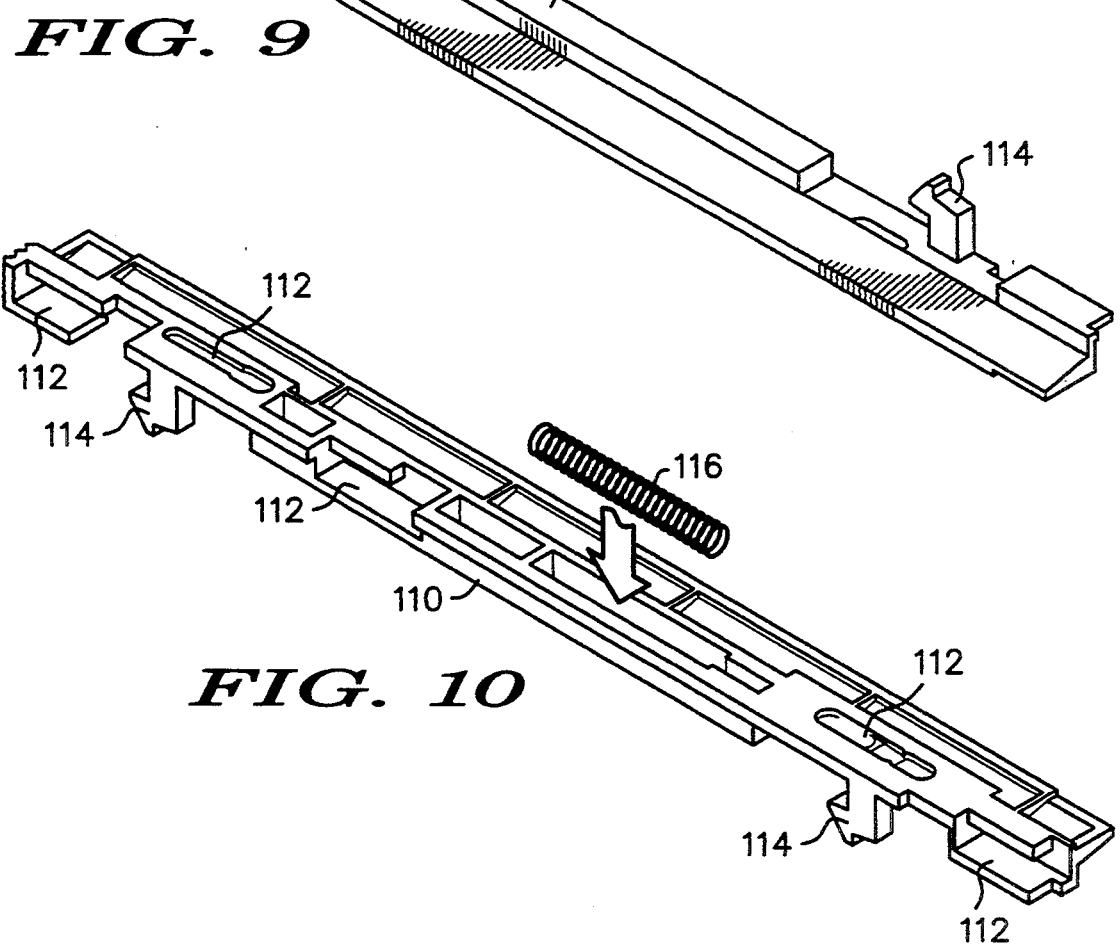
FIG. 9
FIG. 10

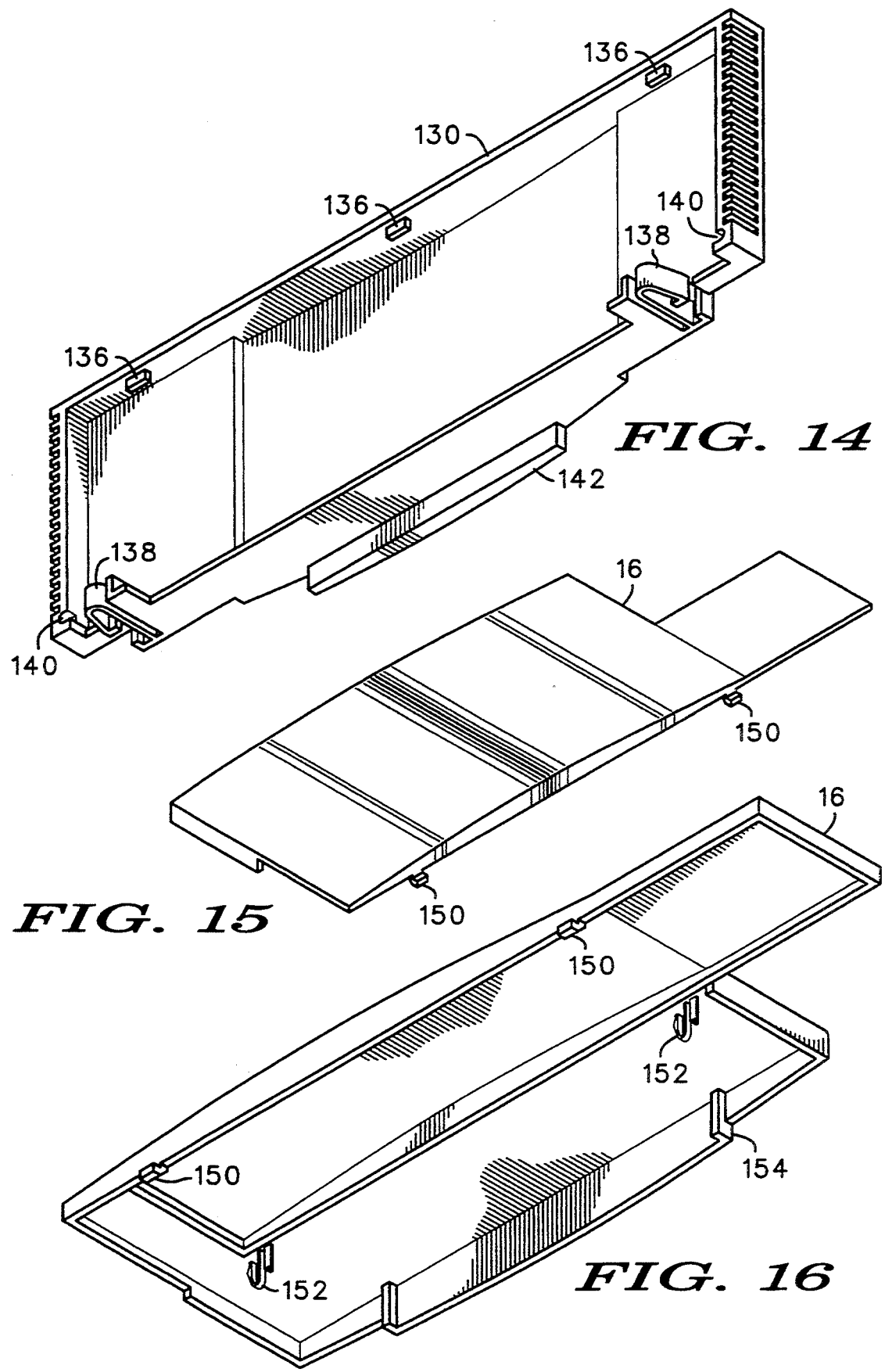

5,407,362

INTERCONNECTING MODULE SYSTEM

RELATED INVENTIONS

The present invention is related to the following inventions:
- (1) "Stackable Computer System", (Design), having Ser. No. 29/010,445, filed Jul. 7, 1993, and assigned to the assignee of the present invention;
- (2) "AC Power Connector", (Design), having Ser. No. 29/010,440, filed Jul. 7, 1993, and assigned to the assignee of the present invention; and
- (3) "Inter-module Semi-Rigid Cable Connector and Configuration of Modules Employing Same", having Ser. No.08/091,505, filed Jul. 14, 1993, and assigned to the assignee of the present invention.

TECHNICAL FIELD

This invention relates generally to modular systems and, in particular, to a system where modules can mechanically and electrically interconnect to each other.

BACKGROUND OF THE INVENTION

Conventional computer systems have at least one module or chassis. The module has a fixed number of slots for holding a certain number of printed circuit boards, such as single board computers and boards for controlling peripheral devices, for example. For complex computer system configurations, there could be many cables interconnecting each of the boards in the modules.

Modules are commercially available in a variety of sizes; the smallest module may be capable of holding a few printed circuit boards, while the largest module may be able to contain many printed circuit boards. If a user wanted to add more printed circuit boards to a module in which all the slots of the module were filled, the user would have to purchase a new module that would be capable of holding all of the printed circuit boards. Thus, conventional modules are not expandable for accommodating more printed circuit boards.

Conventional computer systems are inflexible because a completely new module has to be purchased every time a user wants to add more boards to a module in which all the printed circuit board slots are filled. Consequentially, a user typically buys a large module capable of holding a large amount of boards even if all the slots would not be filled. The large module would be capable of holding additional boards when they must be added to the system configuration.

Buying a large module or chassis has many disadvantages. First, large modules are expensive. Second, large modules occupy more office or desk-top space than smaller systems. Third, large modules are difficult to manufacture and are more likely to have manufacturing and assembly defects since they require more components. Fourth, a probability for more manufacturing and assembly defects in large modules translates into more chances for system failure.

Accordingly, there exists a significant need for a computer system in which printed circuit boards can be added to the system without requiring a purchase of a large module.

SUMMARY OF THE INVENTION

The present invention has utility in mechanically and electrically interconnecting modules or chassis to each other. The modules are capable of being stacked on top of each other. More modules can be added to a system without completely discarding the original module, thus making more slots available for adding more printed circuit boards to the system. Moreover, modules can be added or removed from the stack by hand or without requiring any mechanical tools such as a screw driver.

Thus it is an advantage of the present invention to mechanically and electrically connect modules to each other.

Another advantage of the present invention is to stack the modules on top of each other.

Yet another advantage of the present invention is to provide standard modular components for each of the modules so that manufacturing a module is simplified.

It is another advantage of the present invention that different size computer systems can have the same basic modular architecture and that each module has common parts for connecting the module to other modules.

Yet another advantage of the present invention is to reduce manufacturing cycle time and defects because of the limited amount of parts for each of the modules.

Another advantage of the present invention is to provide a module which is relatively compact and which has significant esthetic appeal.

According to one aspect of the invention, an interconnecting module system comprises a module comprising means for propagating a signal; a latch connected to the module; a base comprising means for providing the signal and means for aligning and connecting the module to the base and the propagating means to the providing means; and wherein the latch connects the module to the base.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

FIG. 5 shows how and where the terminator fits into the base in accordance with a preferred embodiment of the present invention;

FIG. 9 shows a bottom view of a latch in accordance with a preferred embodiment of the present invention;

FIG. 10 shows a top view of a latch in accordance with a preferred embodiment of the present invention;

FIG. 14 shows the back of a bezel of a peripheral module in accordance with a preferred embodiment of the present invention;

FIG. 15 shows a crown in accordance with a preferred embodiment of the present invention; and FIG. 16 shows an underside view of a crown in accordance with a preferred embodiment of the present invention.

DESCRIPTION OF THE PREFERRED EMBODIMENTS

Figure 1:
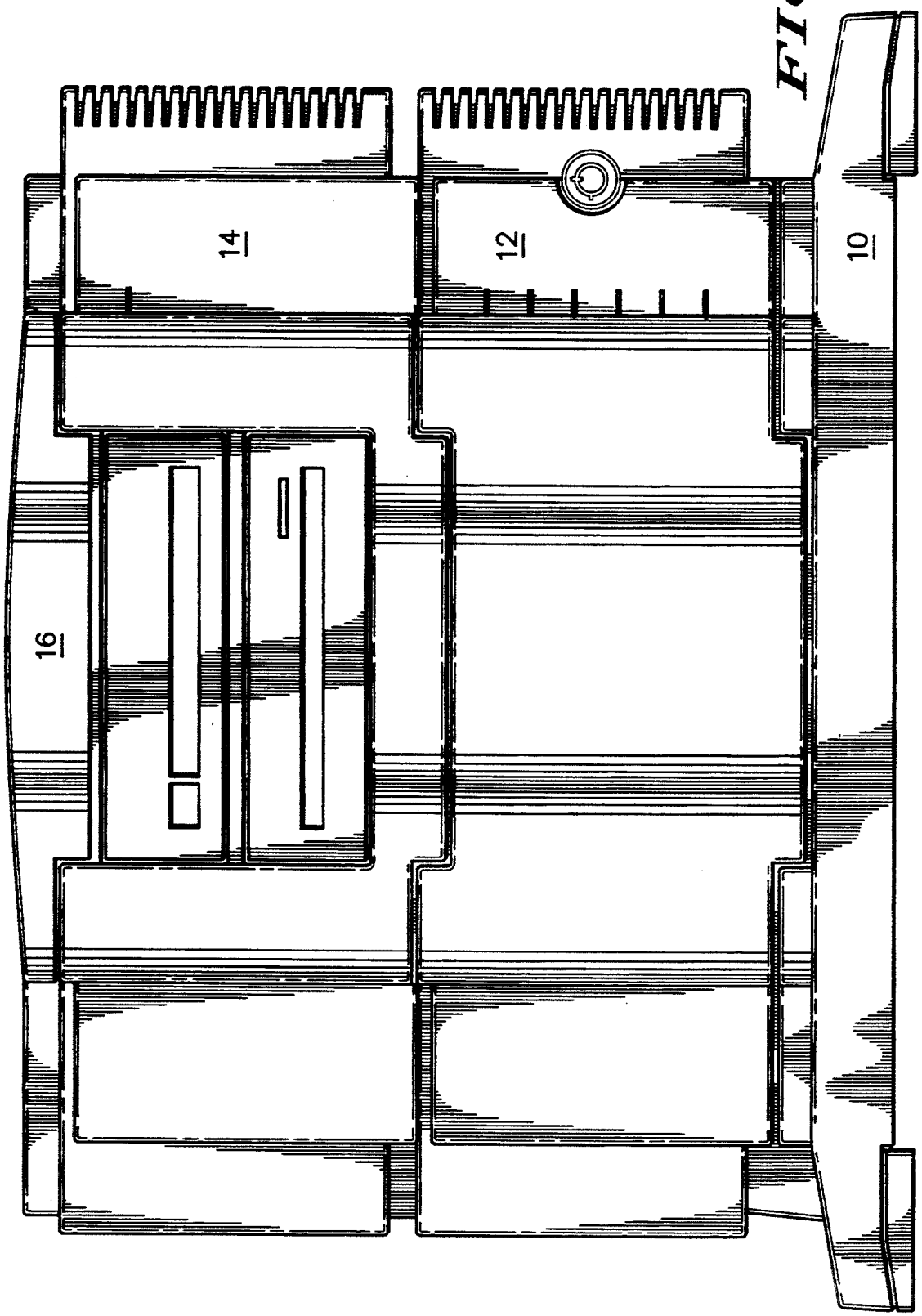
FIG. 1 shows an interconnecting module system in accordance with a preferred embodiment of the present invention.

FIG. 1 shows an interconnecting module system 5 in accordance with a preferred embodiment of the present invention. Interconnecting module system 5 comprises base 10, two modules 12, 14 and crown 16. As shown in FIG. 1, base 10 is at the bottom of interconnecting module system 5, module 12 is stacked on top of base 10, module 14 is stacked on top of module 12 and crown 16 covers a portion of the top and side of module 14.

Base 10 provides stability and support to stack modules 12, 14 on top of base 10 and each other. Base 10 is physically wider than modules 12, 14. In addition, base 10 lifts modules 12, 14 away from the dusty air near the floor, helps keep cooling vents free of blockage and prevents accidental seepage of water into system 5.

As shown in FIG. 1, modules 12, 14 can be stacked on top of base 10 and each other. According to a preferred embodiment, module 12 holds and interconnects a number of circuit boards, such as single board computers and MVME boards commercially available from Motorola, Inc., for example, while module 14 holds and interconnects a number of peripheral devices, such as CD ROM, tape storage devices and other SCSI (small computer system interface) devices, for example. Modules 12, 14 are not restricted to or limited to holding only circuit boards or peripheral devices but may also hold other type of electrical devices or components.

Modules 12, 14 mechanically interlock or interconnect to base 10 and each other by using a latching mechanism (explained below) so that they can be stacked in the vertical direction. Moreover, crown 16 and the bezels of each of the modules 12 and 14 interlock so that it is impossible to remove a module at the bottom of the stack without first removing the crown and the bezels of other modules stacked above the bottom module.

Additions to interconnecting module system 5 can be accomplished by latching additional modules any place within the stack. Since both module 12 and module 14 have the same features to permit them to be stacked in the vertical direction, interconnecting module system 5 is easily assembled and disassembled without using any tools.

Figure 2:
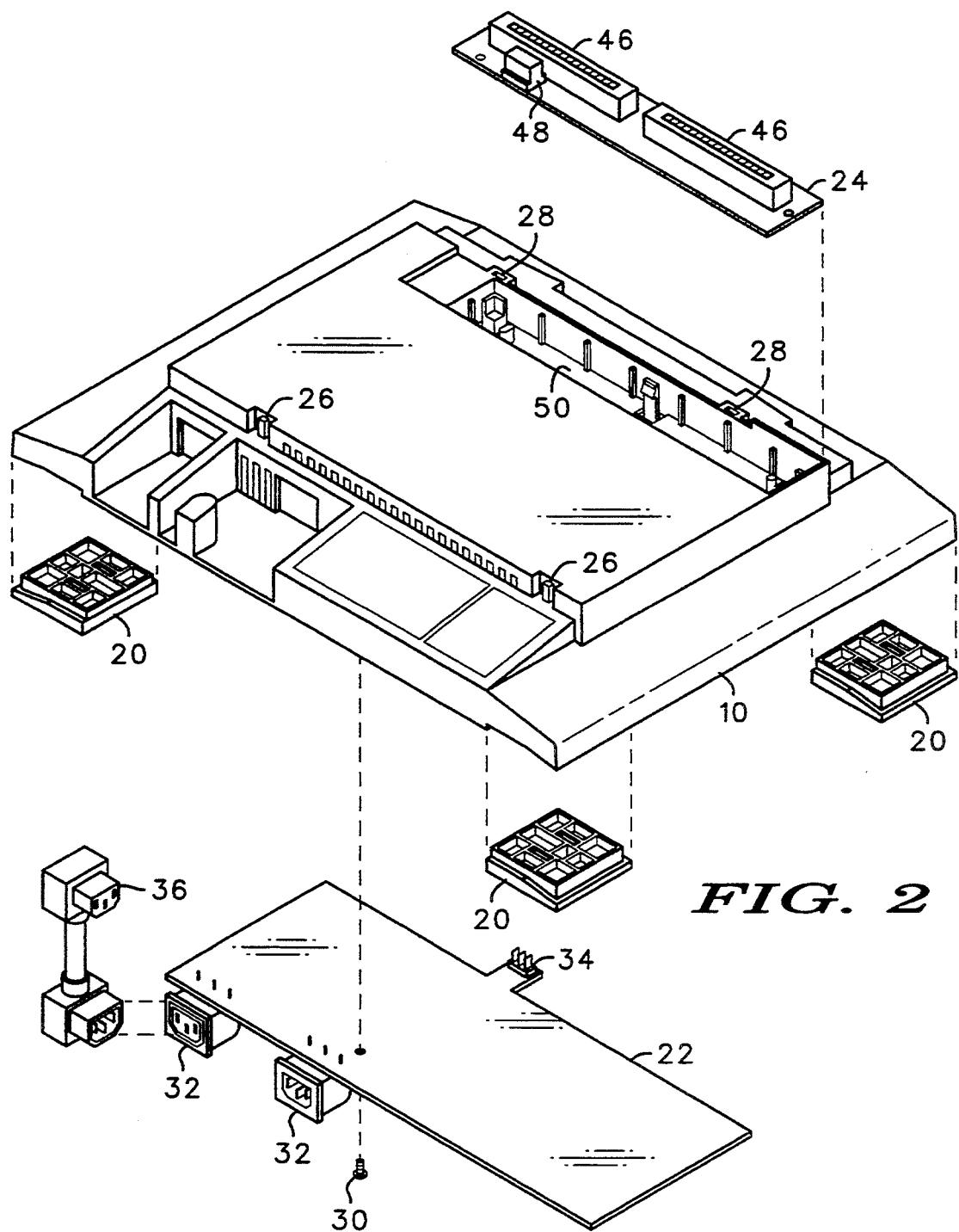
FIG. 2 shows an exploded view of a base of the interconnecting module system in accordance with a preferred embodiment of the present invention.

FIG. 2 shows an exploded view of base 10 of interconnecting module system 5 in accordance with a preferred embodiment of the present invention. Base 10 is made of plastic and provides stability and support so that a number of modules can be stacked on top of it. As shown in FIG. 2, base 10 comprises foot pads 20, base power supply unit 22, terminator 24, pegs 26 and slots 28.

There is one foot pad 20 in each corner of base 10 for a total of four foot pads 20 per base 10. Each of the four foot pads 20 is made of rubber. Foot pads 20 of base 10 add to the support structure of base 10 to prevent a stack of interconnecting modules from tipping-over. Moreover, foot pads 20 prevent slipping of interconnecting module system 5 on a smooth surface.

Figure 4:
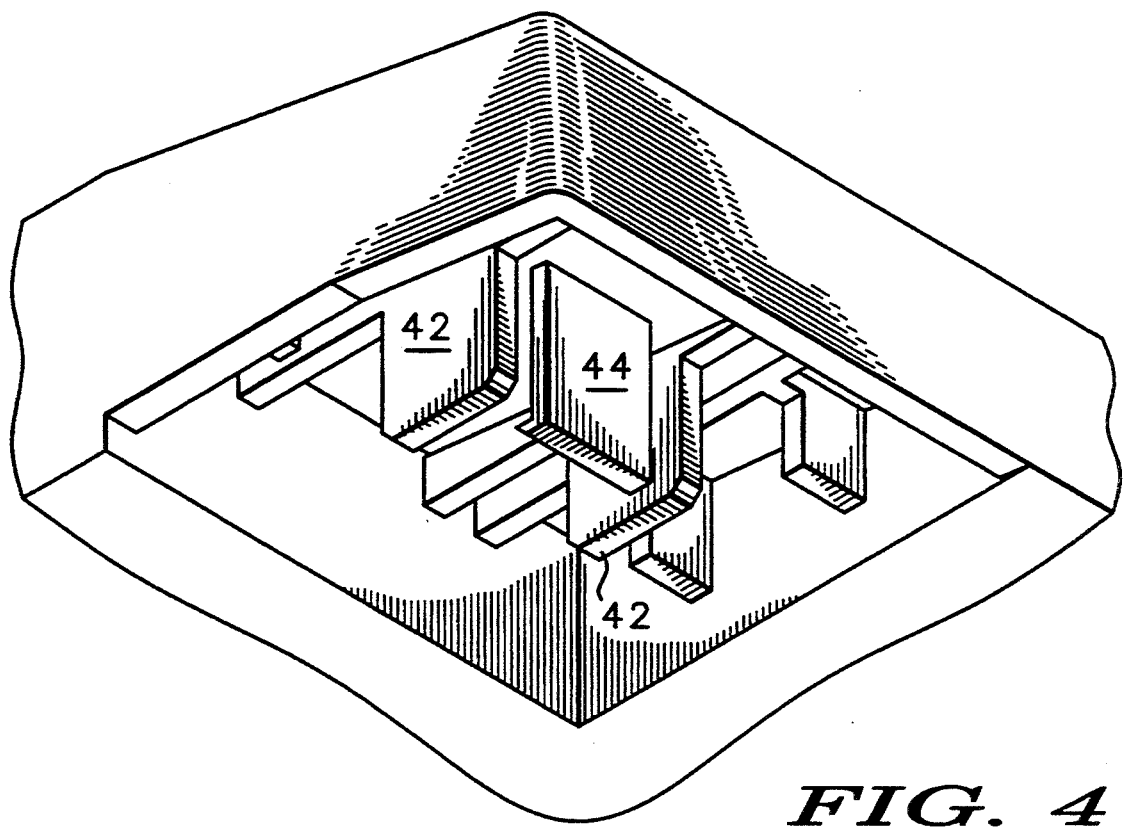
FIG. 4 shows an enlarged view of the bottom of a corner of a base in accordance with a preferred embodiment of the present invention.
Figure 3:
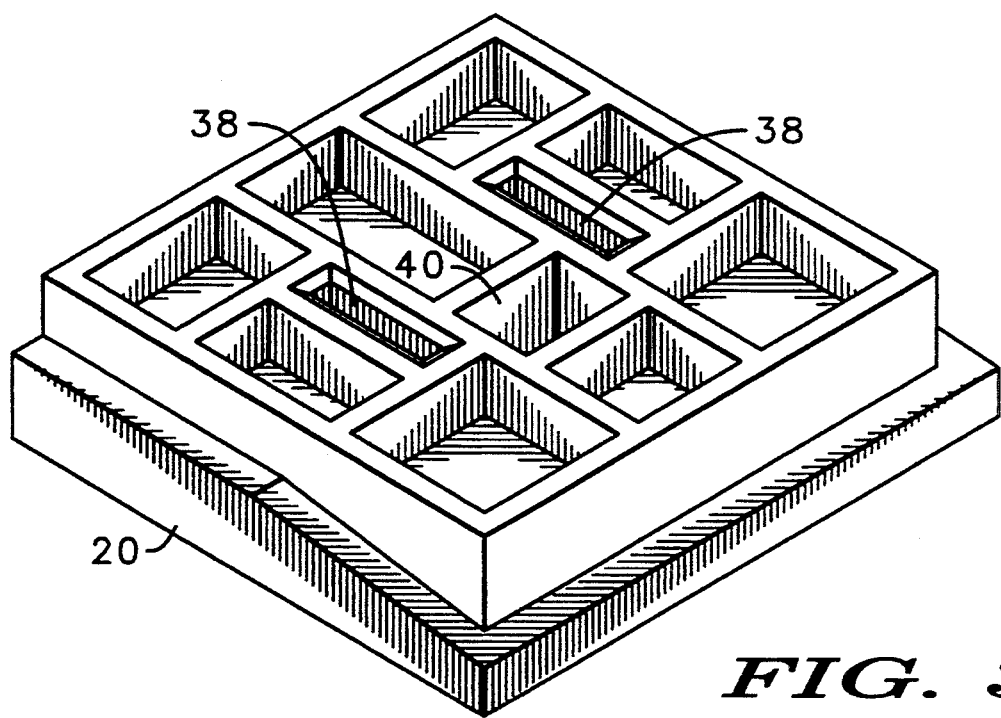
FIG. 3 shows a foot pad in accordance with a preferred embodiment of the present invention.

Each of the foot pads 20 snaps into one of the corners of base 10 as shown in FIGS. 3 and 4. FIG. 3 shows a foot pad 20 in accordance with a preferred embodiment of the present invention. As shown in FIG. 3, foot pad 20 is square in shape and has slots 38 and opening 40. The perimeter of foot pad 20 is level on one half and slanted on the other half. Only opening 40 goes completely through foot pad 20. Opening 40 has a clip or ledge inside of it (not shown) where a clip of base 10 will latch onto it.

FIG. 4 shows an enlarged view of a corner of base 10 in accordance with a preferred embodiment of the present invention. As shown in FIG. 4, each corner of base 10 has two foot pad posts 42 and one foot pad clip 44. Foot pad posts 42 and foot pad clip 44 are made of plastic. Foot pad 20 is secured onto a corner of base 10 by first aligning slots 38 of foot pad 20 with foot pad posts 42 and aligning opening 40 with foot pad clip 44. When foot pad 20 is pressed down, foot pad posts 42 slide into slots 38 and foot pad clip 44 passes through opening 40 and snaps onto a ledge in opening 40. As shown in FIG. 4, foot pad clip 44 has a shape similar to an "r". The top part of the "r" of foot pad clip 44 engages the ledge in opening 40 in foot pad 20 to hold it securely into base 10. To remove foot pad 20, foot pad clip 44 first has to be pushed backward to disengage the foot pad clip 44 from the ledge in opening 40 of foot pad 20 and then foot pad 20 is pulled out of slots 38 from base 10.

Returning to FIG. 2, base power supply unit 22 fits into the underside of base 10 and is held in base 10 via screw 30 which is the only screw in interconnecting module system 5. All of the parts for connecting one module to base 10 or another modules are made of plastic. Base power supply unit 22 is a printed circuit board which comprises a variety of electronic components for converting AC line power to 5-volt DC power. As shown in FIG. 2, base power supply unit 22 has two AC power plugs 32 and three-prong unit 34. One of the AC power plugs 32 (male) receives AC power from an AC outlet (provided from a wall socket, for example). Base power supply unit 22 converts the AC line power into 5-volt DC power via commercially available electrical components. The other power plug 32 (female) provides AC power to other modules stacked on top of base 10 via AC power connector 36 shown in FIG. 2, as described in greater detail in Related Invention No. 3.

Base power supply unit 22 supplies 5-volts power to the other modules in the stack via three-prong unit 34 which is connected to terminator 24 and to a number of backplanes of modules. Three-prong unit 34 has three protruding prongs. According to a preferred embodiment, the middle prong of three-prong unit 34 provides ground while both of the outside prongs provide 5-volt DC power.

Terminator 24 propagates electrical signals from the base to other modules connected to it. As shown in FIG. 2, terminator 24 comprises two (male) backplane connectors 46 and three-prong receiver 48. The three-prongs of three-prong unit 34 slide into three-prong receiver 48. Three-prong receiver 48 connects directly to connectors 46 of terminator 24. Connectors 46 propagate 5-volts power and ground from base power supply unit 22 to other modules in the stack via a number of interconnected backplanes which are connected to connectors 46.

FIG. 5 shows base recess 50 of base 10 into which terminator 24 fits in accordance with a preferred embodiment of the present invention. As shown in FIG. 5, opening 50 has a number of terminator clips 52, module alignment posts 54 and terminator alignment posts 56. Terminator 24 is placed inside base recess 50 by aligning a curved slot in terminator 24 with terminator alignment post 56 and the top of terminator 24 with module alignment posts 54 all which are shown on the leftside of base recess 50 in FIG. 5. Once this end of terminator 24 is aligned in base recess 50, terminator 24 is pushed down in the middle so that terminator clips 52 in the middle of base recess 50 engage terminator 24 and the three-prongs of three-prong unit 34 slide into three-prong receiver 48. Finally, terminator 24 is pushed down so that terminator clip 52 shown on the rightside of base recess 50 in FIG. 5 engages and secures terminator 24 into base 10.

Terminator alignment posts 56 shown on the right of base recess 50 in FIG. 5 have a circular peg or column protruding in the vertical direction. Each of the circular pegs passes through a corresponding hole in terminator 24. This feature also aligns terminator 24 in base recess 50 so that terminator clip 52 (shown on the right side of FIG. 5) engages and secures terminator 24.

Returning to FIG. 2, the top of base 10 comprises a number of pegs 26 and slots 28. Pegs 26 and slots 28 are used for aligning a module on top of base 10. Hooks (not shown) inside of slots 28 are used by a latching mechanism to secure a module on top of base 10. Pegs 26 and slots 28 are also found on top of each of the modules in the same location and dimensions. This permits any module to be stacked on top of base 10 and any module to be stacked on top of any other module.

Figure 6:
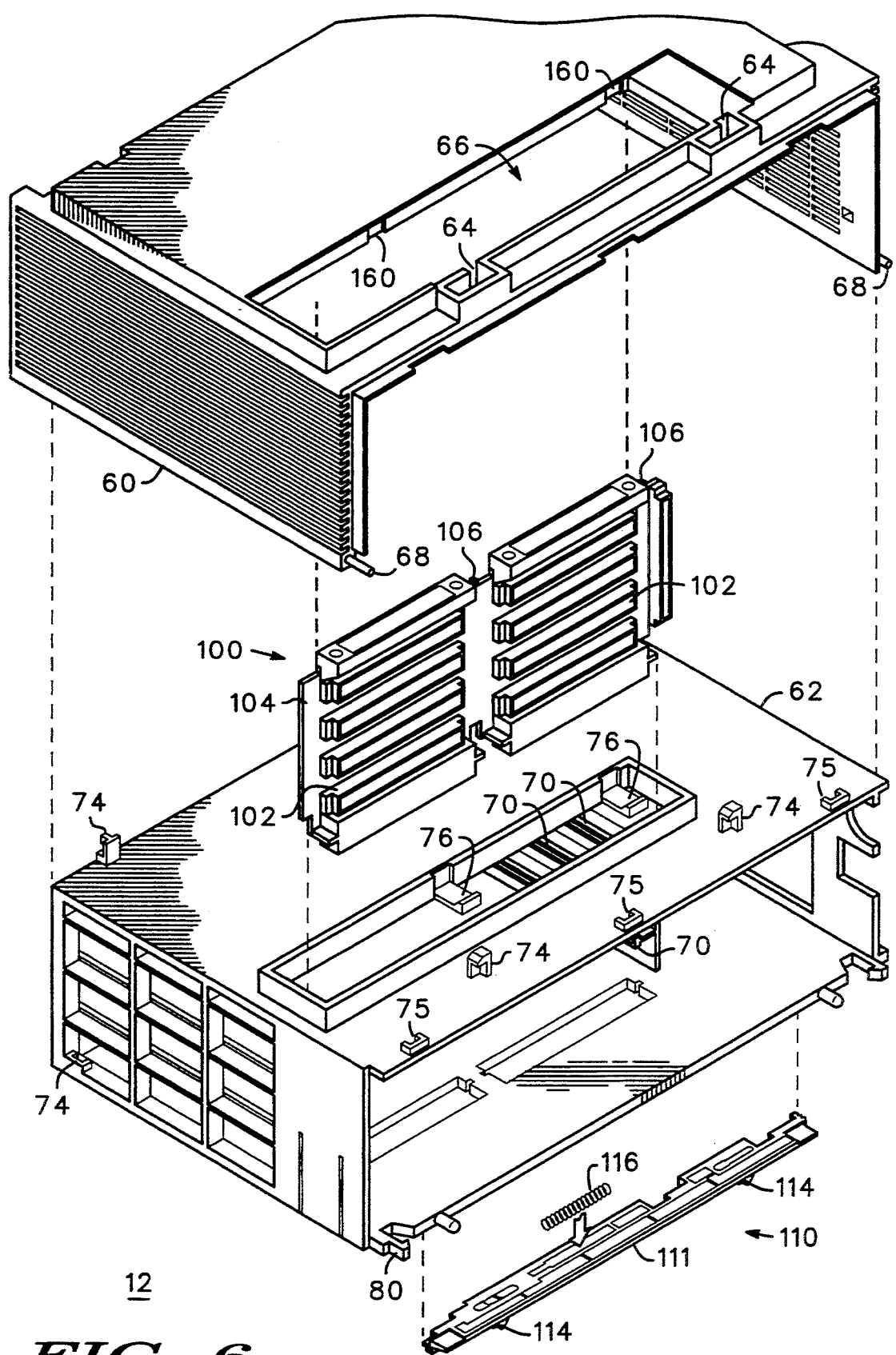
FIG. 6 shows an exploded view of a circuit board module in accordance with a preferred embodiment of the present invention.

FIG. 6 shows an exploded view of circuit board module 12 in accordance with a preferred embodiment of the present invention. Circuit board module 12 comprises enclosure 60 and frame 62. Enclosure 60 fits on top of frame 62. Enclosure 60 and frame 62 are made of plastic.

Enclosure 60 comprises hook slots 64, enclosure opening 66 and bezel pegs 68. Hook slots 64 enclose hooks 74 of frame 62 when enclosure 60 is secured to frame 62. Hook slots 64 are similar to slots 28 of base 10.

Enclosure opening 66 is where backplane 100 passes through circuit board module 12 and connects to terminator 24. (As described above, terminator 24 is installed in base 10.) The location and dimensions of enclosure opening 66 is similar to the location and dimensions of base recess 50. This modular design ensures that any circuit board modules 12 will always fit on top of base 10. Bezel pegs 68 align a bezel to circuit board module 12.

Enclosure 60 is an exterior plastic component of circuit board module 12. Enclosure 60 has a top, two ventilation sides, and a back. As shown in FIG. 6, enclosure 60 does not have a bottom or a front. The bottom of circuit board module 12 is provided by frame 62 while the front is provided by a bezel. Enclosure 60 has two sides which have evenly spaced horizontal openings for providing proper ventilation for circuit boards and a power supply. The back of enclosure 60 has openings for AC power plugs.

Frame 62 comprises circuit board slots 70, pegs 72, hooks 74, bezel slots 75, backplane clips 76, sockets 78, latch posts 80 and alignment bosses 82. Circuit board slots 70 are where circuit boards, such as single board computers and MVME boards commercially available from Motorola, Inc., are slid into circuit board module 12 and inserted into and secured in backplane 100. Although in a preferred embodiment circuit board module 12 is capable of holding four circuit boards, circuit board module 12 can be made larger to accommodate more circuit boards or smaller to contain a lesser number of circuit boards.

Figure 7:
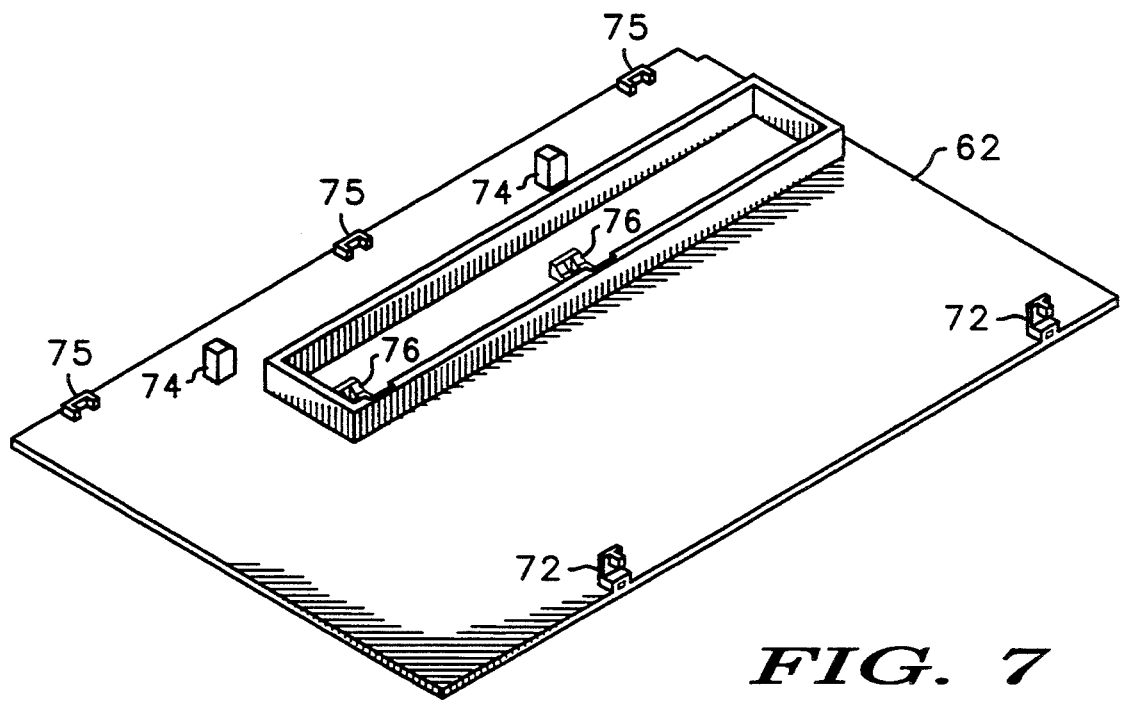
FIG. 7 shows a reverse view of the top of a frame of a circuit board module in accordance with a preferred embodiment of the present invention.

FIG. 7 shows a reverse-view of the top of frame 62 of circuit board module 12 in accordance with a preferred embodiment of the present invention. FIG. 7 provides a better view of where pegs 72, hooks 74, bezel slots 75 and backplane clips 76 are located. As shown in FIG. 7, there are two pegs 72 on the top of circuit board module 12. Pegs 72 exactly match the location and dimension of pegs 26 of base 10. Although pegs 72 are exposed in FIG. 7, everything except the protrusion of the front-top of the back of the chair-like structure of pegs 72 is covered by enclosure 60 when enclosure 60 is fastened to frame 62. Pegs 26 (FIG. 2) help align circuit board module 12 on top of base 10, while pegs 72 shown in FIG. 7 are used to align another module on top of the circuit board module 12.

Hooks 74 match the location and dimensions of the hooks in slots 28 of base 10. Hooks 74 fasten to hooks 114 of latch 110 (shown in FIG. 6 and explained below so that a module is secured to base 10 or another module. Hooks 74 of frame 62 slide into slot 64 of enclosure 60 when enclosure 60 is fastened to frame 62.

Backplane clips 76 shown in FIG. 7 secure or clamp backplane 100 to the inside of frame 62. A backplane similar to backplane 100 shown in FIG. 6 is mounted inside every circuit board module 12. Backplane 100 connects a number of circuit boards in one circuit board module 12 to other circuit boards (such as MVME boards, for example) in other circuit board modules 12 stacked in the stack of modules.

Backplane 100, as shown in FIG. 6, comprises a number of connectors 102, printed circuit board 104 for attaching connectors 102 and backplane pins 106. There are two connectors 102 mounted on the bottom of printed circuit board 104 which connect directly into connectors 46 of terminator 24. Connectors 102 on the bottom of backplane 100 connect to a number of connectors on the back of backplane 100 (not shown in FIG. 6). Moreover, as shown in FIG. 6, backplane 100 has two connectors on the top of print circuit board 104 which connect to other backplanes of circuit board modules 12 stacked on top.

According to the preferred embodiment, there are eight connectors 102 on the back of backplane 100. Since each circuit board module 12 can hold four circuit boards, each pair of connectors 102 connects into a different circuit board. Although in the preferred embodiment backplane 100 has room to hold eight connectors, backplane 100 could be made larger to accommodate more circuit boards or smaller to hold a lesser number of circuit boards.

For each circuit board module 12, there is a corresponding backplane 100. Therefore, when four circuit board modules 12 are stacked on top of each other, each of the backplanes 100 are coupled together via connectors 102 to form one uninterrupted set of backplanes.

Backplane 100 is inserted into circuit board module 12 from the opening in the top of frame 62 shown in FIG. 7. Each of the two connectors 102 on the bottom of backplane 100 passes through one of the two openings on the bottom of frame 62 shown in FIG. 6. The slot on backplane 100 between connectors 102 makes contact with and rests on top of the plastic separator between the openings on the bottom of frame 62. There is an indentation on the plastic separator into which the backplane slot fits. The indentation aligns backplane 100 into the proper position in circuit board module 12.

Once the slot on backplane 100 is engaged in the indentation on separator of frame 62, backplane 100 is rotated so that backplane clips 76 latch onto pins 106 (shown in FIG. 6) on backplane 100. Backplane clips 76 shown in FIG. 7 comprise plastic protrusions in the opening in frame 62 with a hole in the end. The hole fits over or engages backplane pins 106 to secure backplane 100 to frame 62. To remove backplane pins 106 from backplane clips 76, backplane clips 76 have to be rotated upward or pulledup so that pins 106 are freed from the holes in backplane clips 76.

Figure 8:
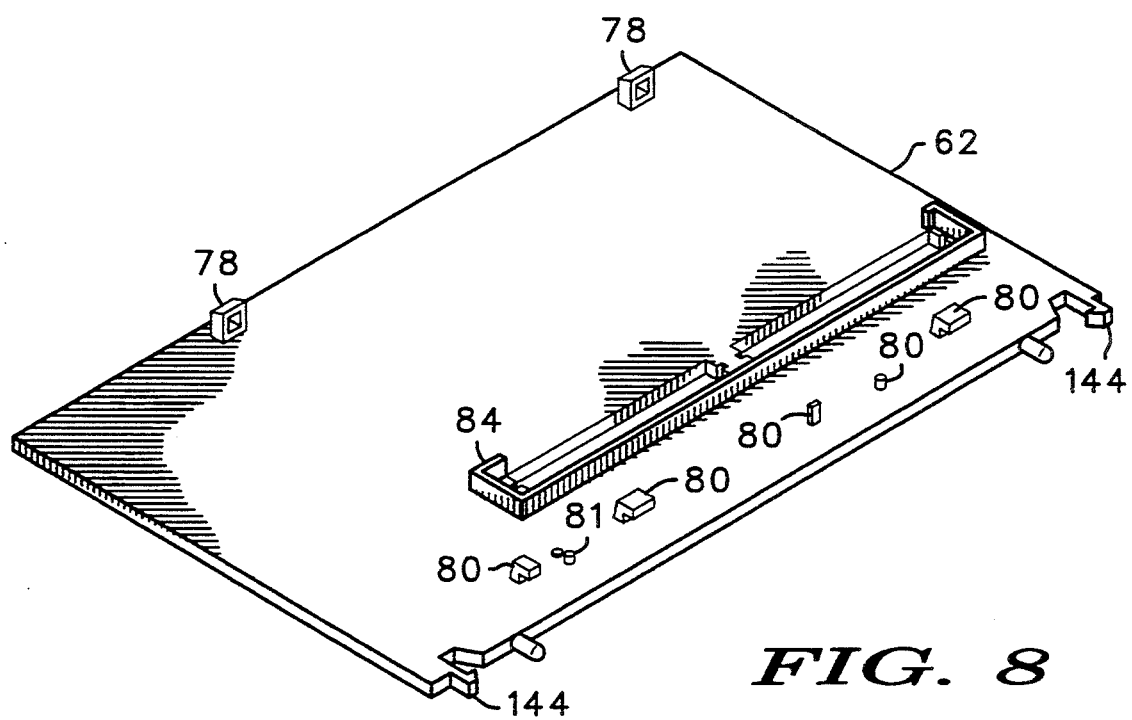
FIG. 8 shows a bottom view of a frame of a circuit board module in accordance with a preferred embodiment of the present invention.

FIG. 8 shows sockets 78, latch posts 80, 81, 82 and alignment boss 84 and also a bottom view of a frame of circuit board module 12 in accordance with a preferred embodiment of the present invention. As shown in FIG. 8, sockets 78 are basically posts with an opening in the middle so that pegs 26 of base 10 or pegs 72 of another circuit board module 12 or peripheral module 14 can fit into them, circuit board module 12 is aligned on top of base 10 when pegs 26 of base 10 fit into sockets 76 of circuit board module 12. By fitting pegs 26 into sockets 76, circuit board module 12 is aligned and partially secured to the top of base 10 or another circuit board module 12 or peripheral module 14 stacked on top of circuit board module 12.

Latch posts 80, 81, 82 shown in FIG. 8 fasten or hold latch 110 onto frame 62. Latch 110 shown in FIG. 6 is shown in more detail in FIGS. 9 and 10. FIG. 9 shows a bottom view of latch 110 while FIG. 10 shows a top view of latch 110 in accordance with a preferred embodiment of the present invention. As shown in FIGS. 6, 9 and 10, latch 110 comprises body 111, key-hole slots 112, hooks 114 and spring 116. Body 111 is the piece of plastic connecting to hooks 114 and containing key-hole slots 112. Spring 116 is inserted into one of the key-hole slots 112.

Key-hole slots 112 of latch 110 (FIG. 10) serve as track means which slide into latch posts 80, 81, 82 (FIG. 8) to secure latch 110 to frame 62. Key-hole slots 112 are held in this position by decompression of spring 116 against latch post 82 shown in FIG. 8. Compression of spring 116 against latch post 82 results in key-hole slots 112 of latch 110 further sliding along latch posts 82. Compression of spring 116 is essential for releasing hooks 114 of latch 110 from hooks of base 10 when circuit board module 12 is being detached from base 10.

Circuit board module 12 is fastened or secured to base 10 by first sliding key-hole slots 112 of latch 110 (FIG. 10) into latch posts 80 of frame 62 (FIG. 8). Next, pegs 26 of base 10 (FIG. 2) are aligned to the two sockets 78 of circuit board module 12 (FIG. 8). Once pegs 26 are inserted into their respective sockets 78, the front of circuit board module 12 is rotated down so that alignment boss 84 (FIG. 8) aligns the outsides of module alignment posts 54 (FIG. 5). This action forces hooks 114 of latch 110 (FIG. 9) to be aligned on top of slots 28 of base 10 (FIG. 2).

Once hooks 114 are aligned above slots 28 (FIG. 2), hooks 114 can be inserted into slots 28 using one of two ways. First, latch 110 can be pushed forward so that spring 116 is compressed and latch posts 80 further slide into key-hole slots 112. This action permits hooks 114 to be inserted into slots 28 of base 10. Second, the top of the front of circuit board module 12 can be further rotated or pushed down so that the angled portion of hooks 114 will slide down over hooks in slots 28. This action also compresses spring 116. Compression of spring 116 is necessary to insert hooks 114 of latch 110 into slots 28 of base 10.

Once hooks 114 are inserted into slots of base 10, latch 110 is released (either manually or automatically) so that spring 116 is also released or decompressed. Thereupon, hooks in slots 28 of base 10 interlock with hooks 114 of latch 110. Circuit board module 12 is forcibly fastened or secured to base 10 via hooks 114 interlocking with hooks of base 10 and pegs 26 fitting into sockets 78. A force needs to be exerted on latch 110 to compress spring 116 to unlock hooks 114 from the hooks in base 10. Otherwise, circuit board module 12 is securely fastened to base 10 even if the stack tips over.

Since each of the circuit boards and peripheral modules have the same parts for connecting one module to the other, the same sequence of events is employed to secure another circuit board or peripheral module to the top of circuit board module 12. Thus, any module can be connected to or stacked on top of base 10 or any other module.

Figure 11:
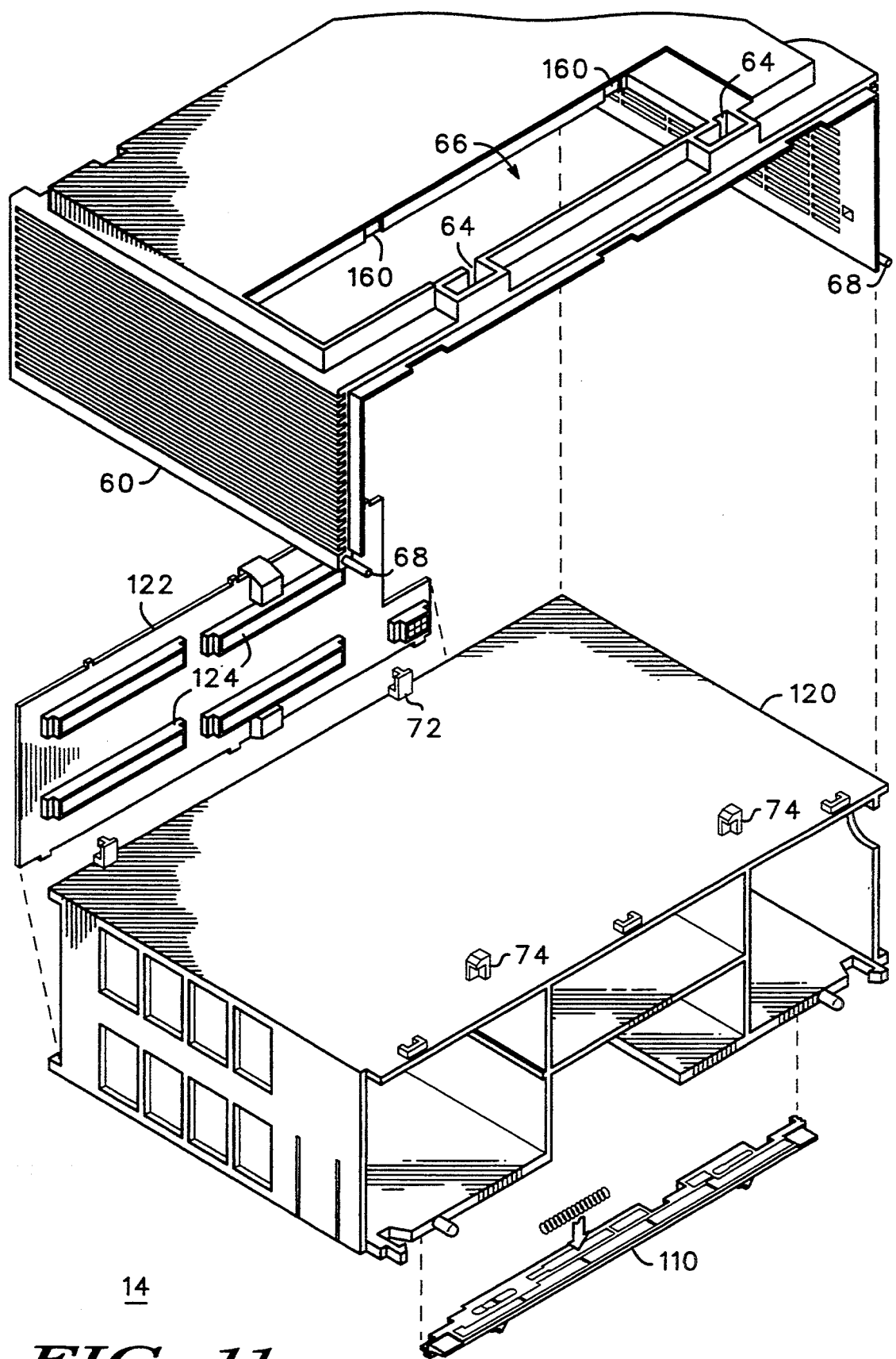
FIG. 11 shows an exploded view of a peripheral module in accordance with a preferred embodiment of the present invention.

FIG. 11 shows an exploded view of peripheral module 14 in accordance with a preferred embodiment of the present invention. Peripheral module 14 contains peripheral devices such as SCSI (small computer system interfaces) devices and CD ROMs, for example. As shown in FIG. 11, peripheral module 14 comprises enclosure 60 and frame 120. Enclosure 60 of peripheral module 14 is exactly the same as enclosure 60 of circuit board module 12. Thus enclosure 60 of peripheral module 14 is interchangeable with enclosure 60 of circuit board module 12. As shown in FIG. 11, enclosure 60 of peripheral module 14 comprises slots 64, enclosure opening 66 and bezel pegs 68.

Frame 120 of peripheral module 14 is similar to frame 62 of circuit board module 12 except that peripheral module 14 holds peripheral devices such as SCSI devices, CD ROM devices or the like, instead of circuit boards. According to a preferred embodiment, peripheral module 14 has four slots for holding four peripheral devices. However, the number of peripheral devices contained in peripheral module 14 can be made larger or smaller depending on the number of peripheral devices required.

The top of frame 120 is similar to the top of frame 62 shown in FIG. 7 which comprises pegs 72, hooks 74 and bezel slots 75. However, there is no opening in the top of frame 120 like circuit board frame 62 because there is no circuit board backplane 100 to connect circuit boards. Backplane 122 located on the back of frame 120 is used to couple peripheral devices to each other. There are four connectors 124 on backplane 122. Backplane 122 is fastened to frame 120 via backplane pins clipping into backplane clips (not shown). When peripheral module 14 is stacked on top of circuit board module 12, an external cable connector (not shown) couples backplane 100 to backplane 122.

The bottom of frame 120 is similar to the bottom of frame 62 shown in FIG. 8. Frame 120 comprises sockets 78 and latch posts 80, all of which are in the same location and have the same size as the corresponding part on frame 62 of circuit board module 12. Latch 110 is fastened to peripheral module 14 and operates in the same manner as described above.

There is no alignment boss 84 on the bottom of frame 120. Alignment of peripheral module 14 on circuit board module 12 or another peripheral module 14 is accomplished by fitting either pegs 26 or pegs 72 into sockets 78 of peripheral module 14 and aligning hooks 114 of latch 110 with the slots 64 of the module below it.

Figure 12:
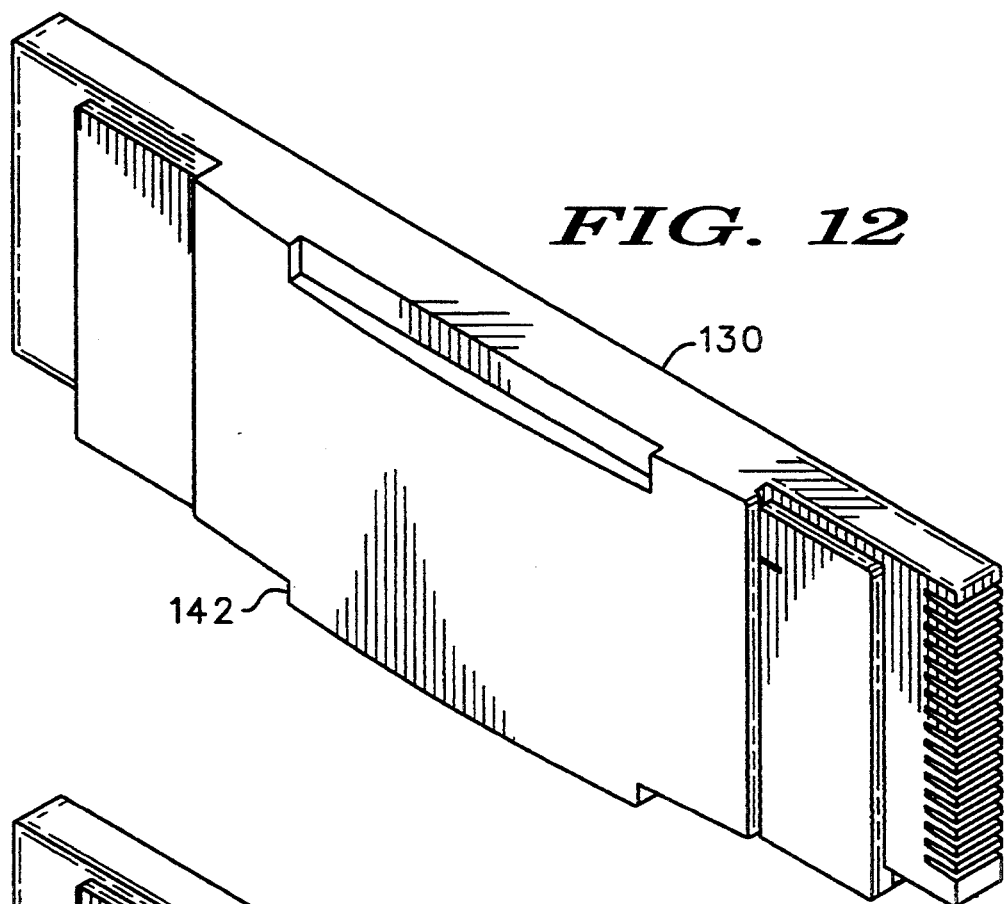
FIG. 12 shows a bezel for a circuit board module in accordance with a preferred embodiment of the present invention.

FIG. 12 shows a front view of bezel 130 in accordance with a preferred embodiment of the present invention. Bezel 130 shown in FIG. 12 is one of the many variations which could be a bezel for circuit board module 12. Although bezel 130 covers the front of circuit board module 12, bezel 130 could be made to cover any side of circuit board module 12. Additionally, bezel 130 of circuit board module 12 may have other features not shown in FIG. 12, such as openings for light pipes and keylock assemblies, for example. Bezel 130 is made of plastic.

Figure 13:
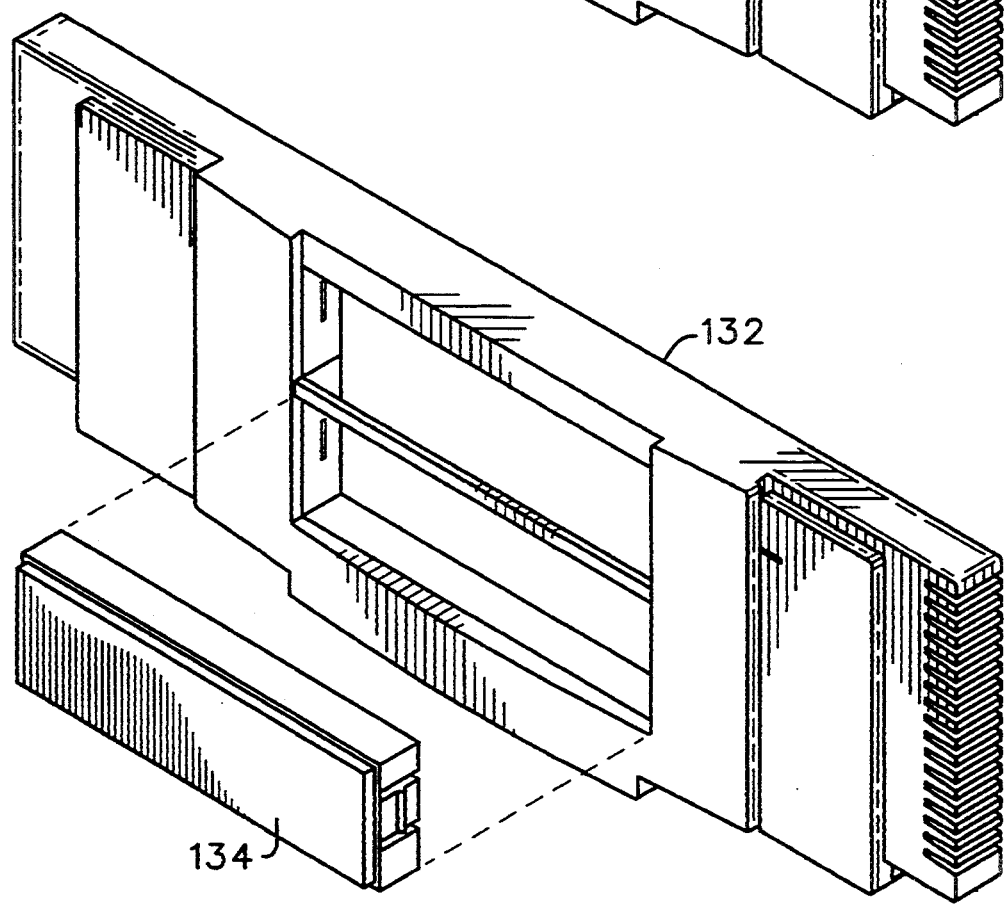
FIG. 13 shows a bezel for a peripheral module in accordance with a preferred embodiment of the present invention.

FIG. 13 shows a front view of bezel 132 for peripheral module 14 in accordance with a preferred embodiment of the present invention. As shown in FIG. 13, bezel 132 of peripheral module 14 has openings for viewing system status lights or other features on peripheral devices. The openings on bezel 132 of peripheral module may be filled with blanking panel 134 also shown in FIG. 13. Both bezel 132 and blanking panel 134 are made of plastic.

FIG. 14 shows a backside view of bezel 130 in accordance with a preferred embodiment of the present invention. Bezel 130 comprises tabs 136, latch finger hooks 138, peg slots 140 and overhang 142. Bezel 130 is fastened to circuit board module 12 by first aligning and inserting tabs 136 (FIG. 14) into bezels slots 75 (FIG. 7). Once tabs 136 are inserted in bezel slots 75, bezel 130 is rotated so that bezel pegs 68 of enclosure 60 (FIG. 6) are inserted in slots 140. Bezel 130 is further rotated until latch finger hooks 138 are inserted and fastened into barbed hooks 144 (FIG. 8). Hooks 138 cover latch 110 so that it is impossible to move latch 110 while bezel 130 is fastened to circuit board module 12.

Once latch finger hooks 138 are fastened into barbed hooks 144, overhang 142 covers a portion of the front of base 10 or another bezel 130 of another circuit board module 12 stacked below. Overhang 142 prohibits the removal of another bezel of a module stacked below. Therefore, in order to remove a module at the bottom of a stack of modules, all bezels must be removed so that latches 110 can be moved in order to release the modules from the stack.

To remove bezel 130 from circuit board module 12, inward force needs to be exerted on latch finger hooks 138 while an outward force pulls the bottom of bezel 130 from circuit board module 12. This action releases latch finger hooks 138 from barbed hooks 144. Further force need to continue to rotate bezel 130 upward so that tabs 136 are released from bezel slots 75.

The parts that are used to connect bezel 130 to circuit board module 12 are the same parts used to connect bezel 132 to peripheral module 14. Therefore, the same method can be used to connect bezel 132 to peripheral module 12 that is used to connect bezel 130 to circuit board module 12.

FIG. 15 shows a top view of crown 16 in accordance with a preferred embodiment of the present invention. Crown 16 is one piece of curved plastic which has a smooth top. Crown 16 fits on top of the stack to cover opening 66 of either circuit board module 12 or peripheral module 14 (depending on which module is on top of the stack).

FIG. 16 shows an underside view of crown 16 in accordance with a preferred embodiment of the present invention. As shown in FIG. 16, crown 16 comprises tabs 150, hooks 152 and overhang 154. Crown 16 is fastened to enclosure 60 (of either circuit board module 12 or peripheral module 14) by first aligning and inserting tabs 150 (FIG. 16) with tab slots 160 (shown in FIGS. 6 and 11) in the back of opening 66 of enclosure 60. Once tabs 150 are inserted in tab slots 160, crown 16 is rotated downward so that hooks 152 are inserted in slots 64 (FIGS. 6 and 11) of enclosure 60 and fastened to hooks 74 of frame 62 of circuit board module 12 or frame 120 of peripheral module 14.

When hooks 152 interlock with hooks 74, crown 16 is fastened and secured to the module which is on top of the stack. Moreover, overhang 154 covers a portion of the bezel 130 or 132 of the module below it. As described above, it is impossible to remove bezels 130 or 132 without first removing crown 16. This is due to interlocking overhangs 142 of bezels 130, 132 and overhang 154 of crown 16 on bezels 130, 132.

To remove crown 16 from module 12 or 14, force needs to be exerted on overhang 142 of crown 16 in the upward direction. This force will disconnect hooks 152 from hooks 74 of module 12 or 14.

It will be appreciated by those skilled in the art that the present invention mechanically and electrically interconnects a number of modules 12, 14 to each other and base 10. Since modules 12, 14 have the same components for mechanically interconnecting them, modules 12, 14 may be stacked on top of each other and on top of base 10. Bezels 130, 132 of modules 12, 14, respectively, are also interconnected so that it is impossible to remove a bezel of a module without first removing crown 16 and the bezels of any modules stacked above the module.

Accordingly, it is intended by the appended claims to cover all modifications of the invention which fall within the true spirit and scope of the invention. For example, although the preferred embodiment of the present invention relates to computer systems, it is intended to cover mechanical and electrical interconnection of other modules such as stereo components, appliances and other electrical or electronic devices. Moreover, other parts may be used for aligning, latching, hooking, fastening, securing and clipping than those disclosed herein. Lastly, the parts may be made of material other than plastic.

What is claimed is:

1. An interconnecting module system, comprising:
   a module comprising
   a printed circuit board,
   means for propagating a signal through the printed circuit board,
   a plurality of sockets, and
   a plurality of posts;
   a latch comprising
   a plurality of tracks, and a plurality of hooks;
a base comprising
    means for providing the signal,
    a plurality of pegs, and
    a plurality of hooks;
said pegs fitting into said sockets,
said hooks of said latch interlocking with said hooks of said base so that said module connects to said base; and
said tracks of said latch sliding into said posts of said module and connecting the means for providing the signal with the means for propagating the signal along the printed circuit board.

2. An interconnecting module system as recited in claim 1, further comprising:
a plurality of modules, each comprising
    a next printed circuit board,
    a next means for propagating the signal through the next printed circuit board,
    a plurality of pegs,
    a plurality of hooks,
    a plurality of posts, and
    a plurality of sockets; and
a plurality of latches, each comprising
    a plurality of tracks, and
    a plurality of hooks;
said pegs of one module fitting into said sockets of another module,
said tracks of each of said latches sliding into said posts of said modules,
said hooks of said module interlocking with said hooks of said another module to fasten said one module to said another module and connect the means for propagating the signal with the next means for propagating the signal.

3. An interconnecting module system as recited in claim 2, further comprising a plurality of bezels, each connected to a corresponding one of said modules.

4. An interconnecting module system as recited in claim 3, wherein a part of a bezel of a module covers part of a bezel of another module.

5. An interconnecting module system as recited in claim 1, further comprising a crown connected to said module.

6. An interconnecting module system as recited in claim 2, further comprising a crown connected to one of said modules.

7. An interconnecting module system as recited in 6, further comprising a plurality of bezels, each connected to a corresponding one of said modules.

8. An interconnecting module system as recited in claim 7, wherein a part of a bezel of a first module covers a part of a bezel of a second module and said crown covers a part of a bezel of said first module.

9. An interconnecting module system as recited in claim 1, further comprising:
a bezel connected to said module; and
a crown connected to said module so that a part of said crown covers a part of said bezel.

10. An interconnecting module system as recited in claim 1, wherein said module comprises
a plurality of latch posts, and
a plurality of hooks;
and wherein said latch comprises
a plurality of tracks connected to said latch posts,
a plurality of hooks, and
a spring which connects said hooks of said latch to said hooks of said module.

11. An interconnecting module system as recited in claim 1, wherein said latch comprises a spring.

12. An interconnecting module system as recited in claim 11, wherein said spring is decompressed to secure said latch to said base.

13. An interconnecting module system as recited in claim 11, wherein said spring is compressed to release said latch from said base.

14. An interconnecting module system as recited in claim 2, further comprising base pads connected to said base.

15. An interconnecting module system as recited in claim 1, further comprising a backplane connected to said module.

16. An interconnecting module system as recited in claim 2, further comprising a plurality of backplanes, each connected to a corresponding one of said modules and connected to each other.

17. An interconnecting module system as recited in claim 1, wherein said module further comprises:
an enclosure; and
a frame connected to said enclosure.

* * * * *